United States Patent
Saiki et al.

(10) Patent No.: US 8,247,841 B2
(45) Date of Patent: Aug. 21, 2012

(54) SEMICONDUCTOR DEVICE AND METHOD FOR MANUFACTURING SEMICONDUCTOR DEVICE

(75) Inventors: Takayuki Saiki, Chino (JP); Shinya Sato, Chofu (JP); Hiroyuki Takamiya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 443 days.

(21) Appl. No.: 12/627,510

(22) Filed: Nov. 30, 2009

(65) Prior Publication Data

US 2010/0133678 A1    Jun. 3, 2010

(30) Foreign Application Priority Data

Dec. 2, 2008 (JP) ................. 2008-307493

(51) Int. Cl.
*H01L 29/66* (2006.01)
*H01L 21/00* (2006.01)

(52) U.S. Cl. ........ 257/173; 257/355; 257/686; 257/773; 257/E23.011; 257/E23.141; 438/107; 438/108; 438/109; 361/56

(58) Field of Classification Search ................ 257/173, 257/355, 686, E23.011, E23.141, 773; 438/107–109; 361/56
See application file for complete search history.

(56) References Cited

U.S. PATENT DOCUMENTS

| | | | |
|---|---|---|---|
| 6,727,533 B2 | 4/2004 | Matsuzaki et al. | |
| 6,936,874 B2 | 8/2005 | Matsuzaki | |
| 7,317,241 B2 | 1/2008 | Matsuzaki et al. | |
| 8,004,088 B2 * | 8/2011 | Lin et al. | 257/773 |
| 8,035,224 B2 * | 10/2011 | Poeppel et al. | 257/724 |
| 2006/0006501 A1 | 1/2006 | Kawano | |
| 2007/0057327 A1 * | 3/2007 | Chen | 257/355 |
| 2008/0142847 A1 | 6/2008 | Matsuzaki et al. | |
| 2009/0237855 A1 * | 9/2009 | Shrier | 361/126 |
| 2009/0283898 A1 * | 11/2009 | Janzen et al. | 257/698 |

FOREIGN PATENT DOCUMENTS

| | | |
|---|---|---|
| JP | U-58-86756 | 5/1983 |
| JP | A-2002-170929 | 6/2002 |
| JP | A-2006-19352 | 1/2006 |
| JP | A-2007-049103 | 2/2007 |
| JP | A-2007-294746 | 11/2007 |
| WO | WO 2005/086216 A1 | 9/2005 |

* cited by examiner

*Primary Examiner* — Julio J Maldonado
*Assistant Examiner* — Maria Ligai
(74) *Attorney, Agent, or Firm* — Oliff & Berridge, PLC

(57) ABSTRACT

A semiconductor device includes: a plurality of semiconductor substrates that are layered; a through electrode penetrating through a predetermined semiconductor substrate of the semiconductor substrates and electrically connected with an external terminal of the semiconductor device; a circuit element provided on the predetermined semiconductor substrate; and an electrostatic discharge protection circuit also provided on the predetermined semiconductor substrate. In the device, wiring resistance between the electrostatic discharge protection circuit and the through electrode is smaller than wiring resistance between the circuit element and the through electrode.

7 Claims, 8 Drawing Sheets

SEMICONDUCTOR DEVICE AND METHOD FOR MANUFACTURING SEMICONDUCTOR DEVICE

The entire disclosure of Japanese Patent Application No. 2008-307493, filed Dec. 2, 2008 is expressly incorporated by reference herein.

BACKGROUND

1. Technical Field

The present invention relates to a semiconductor device and a method for manufacturing a semiconductor device.

2. Related Art

As an electronic apparatus is downsized, a mounting space for an electronic component such as a semiconductor device which is mounted inside the electronic apparatus is further limited. Therefore, electronic components such as a semiconductor device are required to be downsized.

As a method for downsizing a semiconductor device, a method in which a semiconductor device is structured by layering semiconductor substrates (semiconductor chips) is proposed. In this method, semiconductor chips having the same functions as each other or semiconductor chips having different functions from each other are layered and wiring-connected with each other so as to achieve high density mounting of the semiconductor chips.

As a method for wiring-connecting the semiconductor chips, a method is proposed in which a through electrode (wiring electrode penetrating through the semiconductor chips) is provided on the semiconductor chips so as to wiring-connect the semiconductor chips.

In a case where the through electrode is electrically connected with an external terminal of the semiconductor device, a circuit element on the semiconductor chips may be damaged by static electricity inputted through the external terminal. Therefore, it is common to provide an electrostatic discharge (ESD) protection circuit which serves as a discharge path for electric charge inputted by static electricity.

The use of the through electrode increases latitude of wiring between the semiconductor chip and the external terminal. Accordingly, the electrostatic discharge protection circuit is preferably disposed in a manner to correspond to the position of the through electrode.

SUMMARY

The present invention is devised in view of the above technical problems. An advantage of the present invention is to provide a semiconductor device in which damage on a circuit element by electrostatic discharge can be suppressed and a through electrode is used, and a method for manufacturing such the device.

A semiconductor device according to a first aspect of the invention includes: a plurality of semiconductor substrates that are layered; a through electrode penetrating through a predetermined semiconductor substrate of the semiconductor substrates and electrically connected with an external terminal of the semiconductor device; a circuit element provided on the predetermined semiconductor substrate; and an electrostatic discharge protection circuit also provided on the predetermined semiconductor substrate. In the device, wiring resistance between the electrostatic discharge protection circuit and the through electrode is smaller than wiring resistance between the circuit element and the through electrode.

According to the first aspect, since the wiring resistance between the electrostatic discharge protection circuit and the through electrode is smaller than that between the circuit element and the through electrode, electric charge accompanied by electrostatic discharge easily flows to the electrostatic discharge protection circuit. Therefore, a semiconductor device can be achieved in which damage on the circuit element by electrostatic discharge can be suppressed and the through electrode is used.

In the semiconductor device of the first aspect, the electrostatic discharge protection circuit may be connected with the through electrode at the smallest wiring resistance on the predetermined semiconductor substrate.

A semiconductor device according to a second aspect of the invention includes: a plurality of semiconductor substrates that are layered; a through electrode penetrating through a predetermined semiconductor substrate of the semiconductor substrates and electrically connected with an external terminal of the semiconductor device; a circuit element provided on the predetermined semiconductor substrate; and an electrostatic discharge protection circuit also provided on the predetermined semiconductor substrate. In the device, a wiring length between the electrostatic discharge protection circuit and the through electrode is shorter than a wiring length between the circuit element and the through electrode.

According to the second aspect, since the wiring length between the electrostatic discharge protection circuit and the through electrode is shorter than that between the circuit element and the through electrode, electric charge accompanied by electrostatic discharge easily flows to the electrostatic discharge protection circuit. Therefore, a semiconductor device can be achieved in which damage on the circuit element by electrostatic discharge can be suppressed and the through electrode is used.

In the semiconductor device of the second aspect, the electrostatic discharge protection circuit may be connected with the through electrode at the shortest wiring length on the predetermined semiconductor substrate.

In the semiconductor device of the first or second aspect, the through electrode may penetrate through a part of an element constituting the electrostatic discharge protection circuit.

In a method for manufacturing a semiconductor device according to a third aspect of the invention, the semiconductor device includes: a plurality of semiconductor substrates that are layered; a through electrode penetrating through a predetermined semiconductor substrate of the semiconductor substrates and electrically connected with an external terminal of the semiconductor device; a circuit element provided on the predetermined semiconductor substrate; and an electrostatic discharge protection circuit also provided on the predetermined semiconductor substrate. The method includes: determining arrangement-wiring information such that wiring resistance between the electrostatic discharge protection circuit and the through electrode is smaller than wiring resistance between the circuit element and the through electrode. In the method, the semiconductor device is manufactured based on the arrangement-wiring information.

In a method for manufacturing a semiconductor device according to a fourth aspect of the invention, the semiconductor device includes: a plurality of semiconductor substrates that are layered; a through electrode penetrating through a predetermined semiconductor substrate of the semiconductor substrates and electrically connected with an external terminal of the semiconductor device; a circuit element provided on the predetermined semiconductor substrate; and an electrostatic discharge protection circuit also provided on the predetermined semiconductor substrate. The method includes: determining arrangement-wiring information such that a wiring length between the electrostatic discharge protection circuit and the through electrode is shorter than a wiring length between the circuit element and the through electrode. In the method, the semiconductor device is manufactured based on the arrangement-wiring information.

In the method for manufacturing a semiconductor device according to the third or fourth aspect, the arrangement-wiring information may be determined by preparing a design cell that defines an arrangement relationship between the through electrode and the electrostatic discharge protection circuit and by determining a position of the design cell.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments according to the invention will be described below with reference to the accompanying drawings. However, the invention is not limited to the following embodiments. The present invention includes any combination of contents of the following description.

First Embodiment

Semiconductor Device

Figure 1:
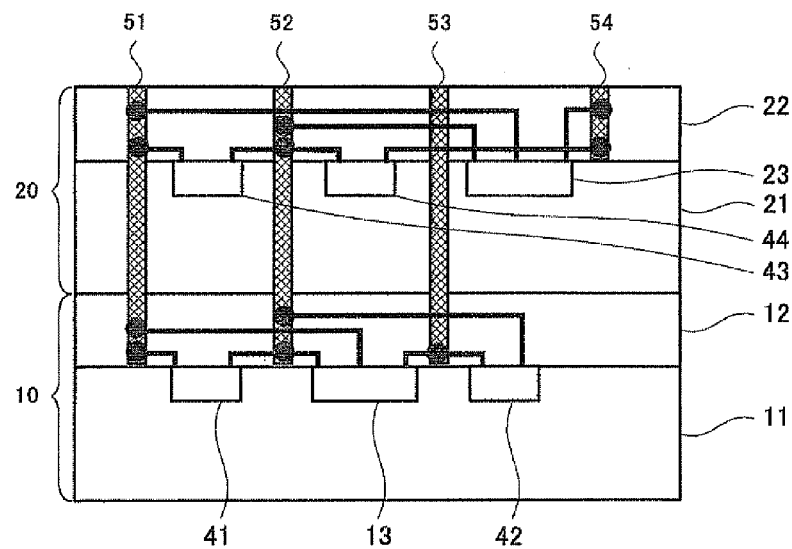
FIG. 1 is a schematic view for explaining an internal structure of a semiconductor device according to a first embodiment of the invention.

FIG. 1 is a schematic view for explaining an internal structure of a semiconductor device according to a first embodiment of the invention. The semiconductor device according to the first embodiment includes external terminals VDD, VSS, Pin1, and Pin2 as well as elements shown in FIG. 1.

This semiconductor device 1 according to the first embodiment includes a plurality of semiconductor substrates. FIG. 1 shows a structure in which semiconductor substrates 10 and 20 are layered.

The semiconductor substrate 10 includes a semiconductor layer 11 and a wiring layer 12. The semiconductor layer 11 is a layer on which a circuit element such as a transistor is formed and is made of a semiconductor containing Si, for example. The wiring layer 12 is a layer on which a wiring for electrically connecting the circuit element, which is formed on the semiconductor layer 11, and a through electrode (details are described later) is formed. The wiring is made of a metal such as Al and Cu.

In a similar manner, the semiconductor substrate 20 includes a semiconductor layer 21 and a wiring layer 22.

The semiconductor substrate 10 includes an internal circuit 13 in the semiconductor layer 11 thereof. The semiconductor substrate 20 includes an internal circuit 23 in the semiconductor layer 21 thereof. The internal circuits 13 and 23 are respectively composed of a plurality of circuit elements (a transistor and the like).

The semiconductor substrate 10 includes electrostatic discharge protection circuits 41 and 42 in the semiconductor layer 11 thereof. The electrostatic discharge protection circuits 41 and 42 serve as a discharge path for an electric charge inputted from an external terminal (not shown) by static electricity, and are formed for protecting the internal circuit 13 from damage by electrostatic discharge.

In a similar manner, the semiconductor substrate 20 includes electrostatic discharge protection circuits 43 and 44 in the semiconductor layer 21 thereof. The electrostatic discharge protection circuits 43 and 44 serve as a discharge path for an electric charge inputted from an external terminal (not shown) by static electricity, and are formed for protecting the internal circuit 23 from damage by electrostatic discharge.

The semiconductor device according to the present embodiment includes through electrodes 51, 52, and 53. The through electrodes 51, 52, and 53 penetrate through the semiconductor substrate 20 and are electrically connected with respective external terminals which are not shown. Diameters of the through electrodes 51, 52, and 53 may be approximately from 30 μm to 50 μm, for example.

The through electrode 51 penetrates through the semiconductor substrate 20 and is electrically connected with an external terminal VDD. The through electrode 52 penetrates through the semiconductor substrate 20 and is electrically connected with an external terminal VSS. The through electrode 53 penetrates through the semiconductor substrate 20 and is electrically connected with an external terminal Pin1.

The semiconductor device according to the present embodiment includes an electrode 54. The electrode 54 electrically connects the semiconductor substrate 20 with an external terminal Pin2. Here, the electrode 54 does not penetrate through the semiconductor substrate 20.

Figure 2:
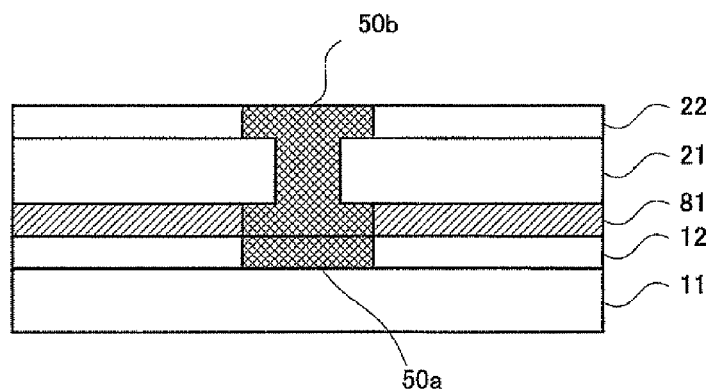
FIG. 2 is a schematic view for explaining an example of a structure of a through electrode.

The through electrodes may be formed after the semiconductor substrates are layered. As shown in FIG. 2 showing an example of a structure of a through electrode, the through electrodes may be structured such that through electrodes 50a and 50b are individually formed on respective substrates, and are electrically connected with each other by layering the substrates.

Here, the wiring layer 12 of the semiconductor substrate 10 and the semiconductor layer 21 of the semiconductor substrate 20 may be bonded to each other with an adhesive 81.

Figure 3:
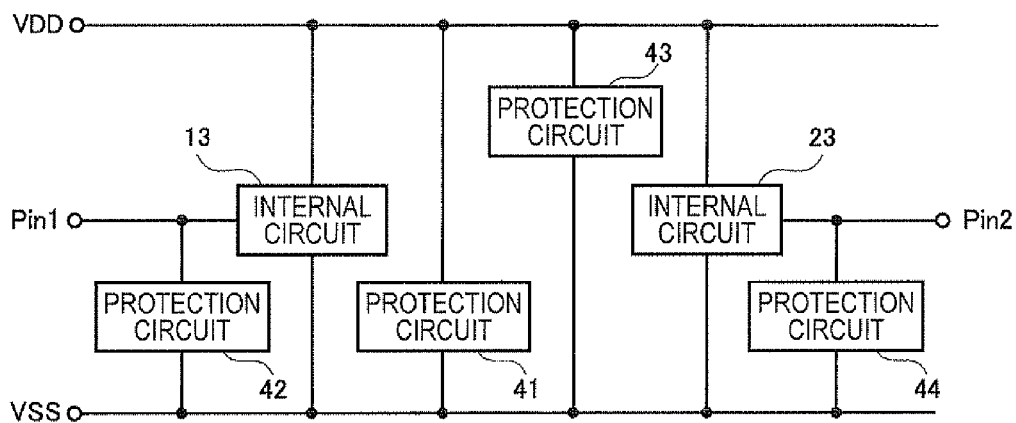
FIG. 3 is a circuit diagram of the semiconductor device according to the first embodiment.

FIG. 3 is a circuit diagram of the semiconductor device according to the present embodiment. The external terminal VDD serves as a power source terminal coupled to a positive potential, and the external terminal VSS serves as a ground terminal coupled to a ground potential. The external terminal Pin1 serves as an input terminal or an output terminal of the internal circuit 13, and the external terminal Pin2 serves as an input terminal or an output terminal of the internal circuit 23.

The through electrode 51 electrically connected with the external terminal VDD is electrically connected with the internal circuit 13 and the electrostatic discharge protection circuit 41 through the wiring layer 12, and is electrically connected with the internal circuit 23 and the electrostatic discharge protection circuit 43 through the wiring layer 22.

The through electrode 52 electrically connected with the external terminal VSS is electrically connected with the internal circuit 13 and the electrostatic discharge protection circuits 41 and 42 through the wiring layer 12, and is electrically connected with the internal circuit 23 and the electrostatic discharge protection circuits 43 and 44 through the wiring layer 22.

The through electrode 53 electrically connected with the external terminal Pin1 is electrically connected with the internal circuit 13 and the electrostatic discharge protection circuit 42 through the wiring layer 12.

The electrode 54 electrically connected with the external terminal Pin2 is electrically connected with the internal circuit 23 and the electrostatic discharge protection circuit 44 through the wiring layer 22.

Figure 4A:
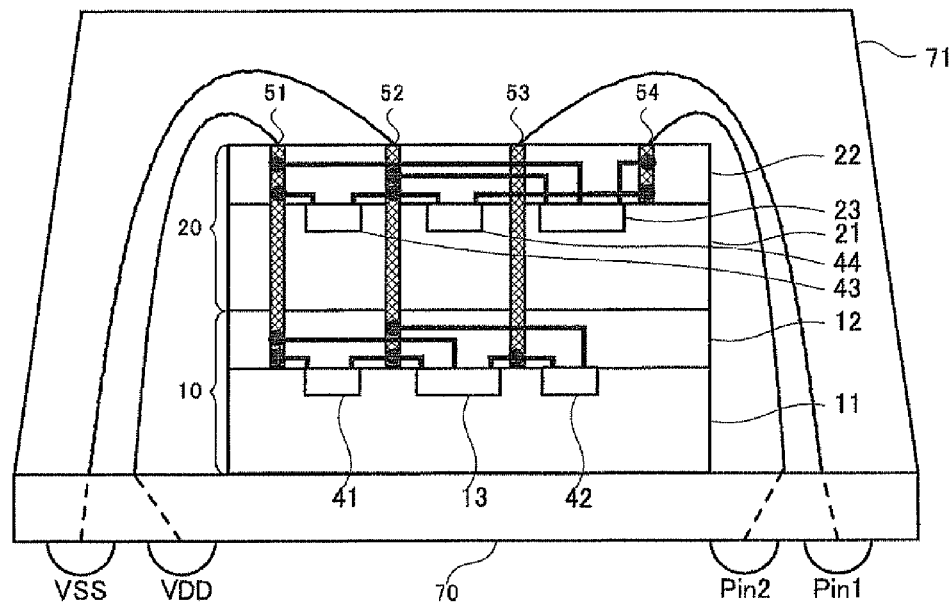
FIGS. 4A and 4B are schematic views for explaining a sectional structure of the semiconductor device according to the first embodiment.
Figure 4B:
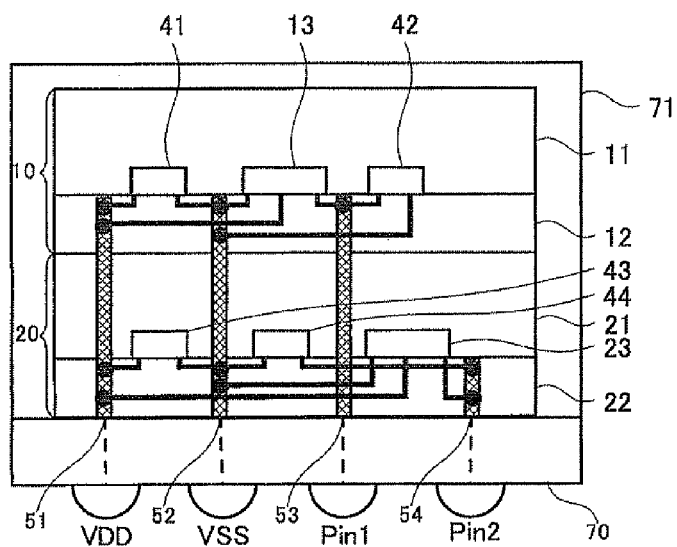

FIGS. 4A and 4B are schematic views for explaining a sectional structure of the semiconductor device according to the first embodiment of the invention. FIG. 4A shows an example of a structure in which a structural body obtained by layering the semiconductor substrates 10 and 20 described with reference to FIG. 1 is disposed with its front surface facing an upside and a molding resin 71 containing the structural body is molded, on a package substrate 70. FIG. 4B shows an example of a structure in which a structural body obtained by layering the semiconductor substrates 10 and 20 described with reference to FIG. 1 is disposed with its front surface facing a downside and the molding resin 71 containing the structural body is molded, on the package substrate 70.

In the example shown in FIG. 4A, the package substrate 70 is provided with the external terminals VDD, VSS, Pin1, and Pin2. The through electrode 51, the through electrode 52, the through electrode 53, and the electrode 54 are electrically connected with the external terminal VDD, the external terminal VSS, the external terminal Pin1, and the external terminal Pin2 respectively, through wirings and bonding wires inside the package substrate 70.

In the example shown in FIG. 4B, a package substrate 70 is provided with the external terminals VDD, VSS, Pin1, and Pin2. The through electrode 51, the through electrode 52, the through electrode 53, and the electrode 54 are electrically connected with the external terminal VDD, the external terminal VSS, the external terminal Pin1, and the external terminal Pin2 respectively, through wirings inside the package substrate 70.

Figure 5:
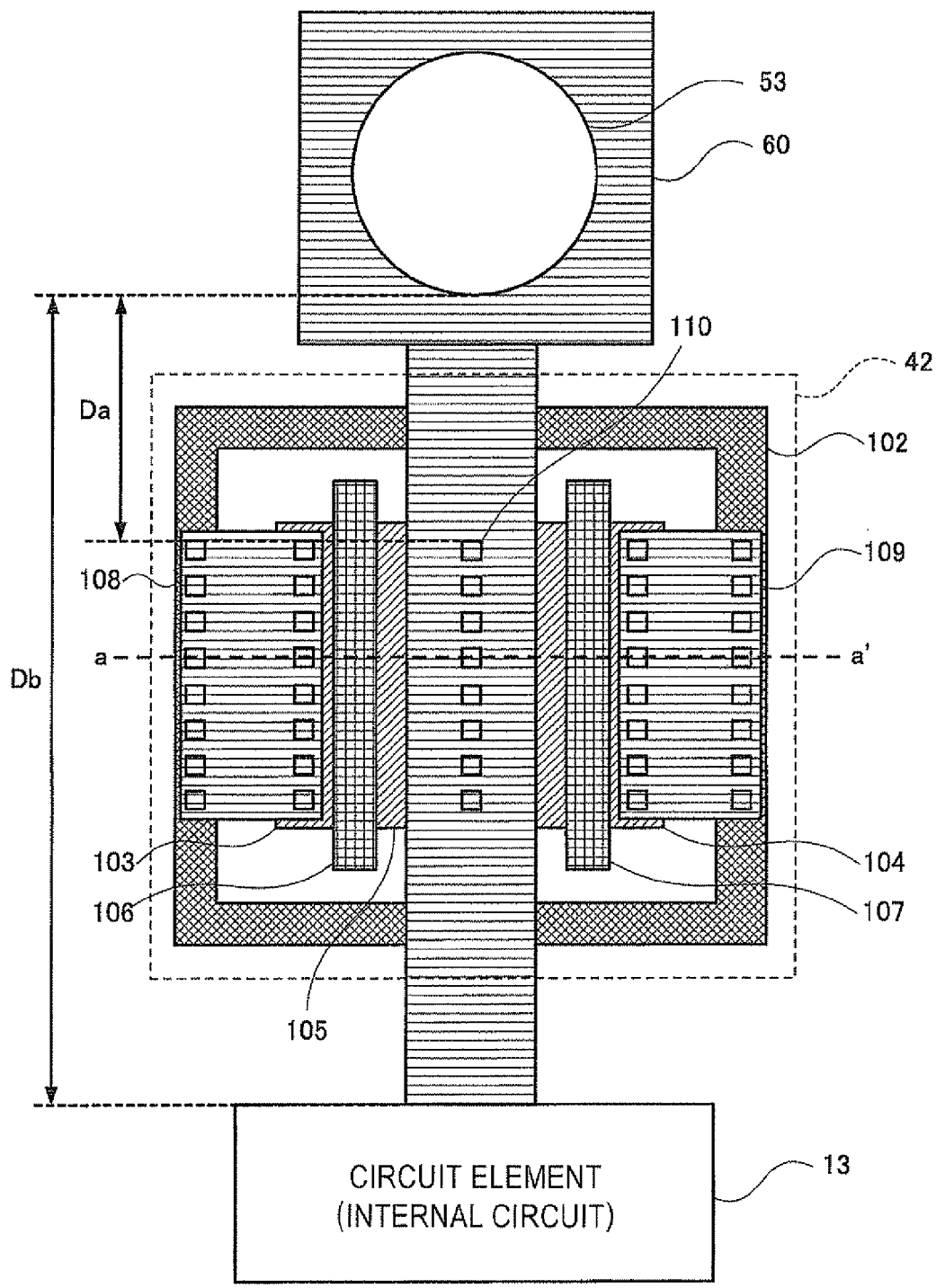
FIG. 5 is a plan view showing an example of arranging relationships between a through electrode and an electrostatic discharge protection circuit and between the through electrode and an internal circuit.

FIG. 5 is a plan view showing an example of arrangement relationships between a through electrode and an electrostatic discharge protection circuit and between the through electrode and an internal circuit. FIG. 5 shows arrangement relationships between the through electrode 53 and the electrostatic discharge protection circuit 42 and between the through electrode 53 and the internal circuit 13. The through electrode 53 is electrically connected with the electrostatic discharge protection circuit 42 and the internal circuit 13 by a wiring 60.

Figure 6:
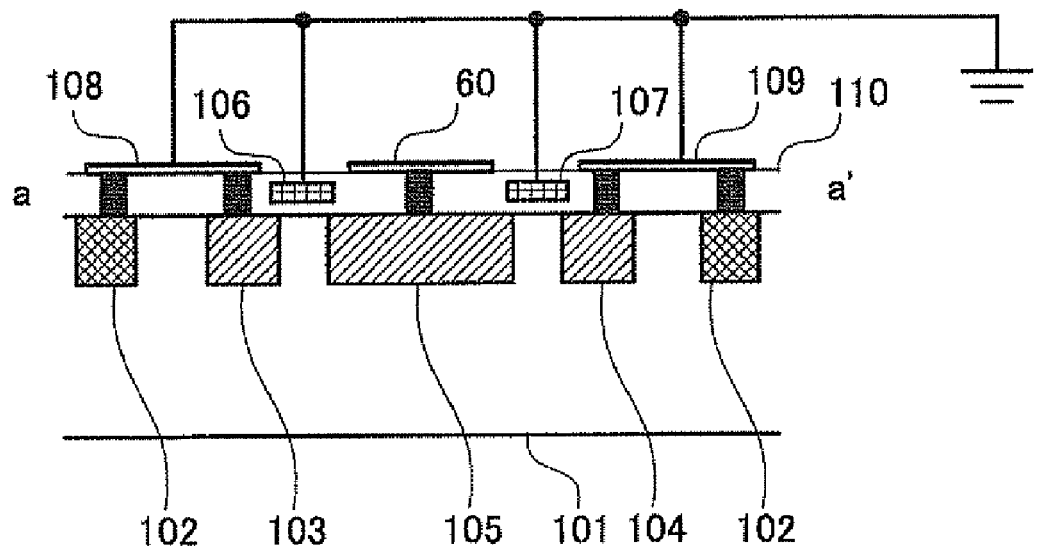
FIG. 6 is a schematic view for explaining a sectional structure of an electrostatic discharge protection circuit.

FIG. 6 is a schematic view for explaining a sectional structure of the electrostatic discharge protection circuit 42. In the present embodiment, the electrostatic discharge protection circuit is composed of a grounded-gate negative-channel metal oxide semiconductor (ggNMOS). FIG. 6 shows a section taken along an a-a' line of FIG. 5.

In the ggNMOS shown in FIGS. 5 and 6, N-diffusion regions 103 and 104 to be source regions and an N-diffusion region 105 to be a drain region are formed in a region surrounded by a P-diffusion region 102, in a P-Well 101.

On the P-Well 101, the P-diffusion region 102, and the N-diffusion regions 103, 104, and 105, formed is a silicon oxide film 110. In the silicon oxide film 110, a poly-silicon layer 106 to be a gate is formed to stride between the N-diffusion region 103 and the N-diffusion region 105, and a poly-silicon layer 107 to be a gate is formed to stride between the N-diffusion region 104 and the N-diffusion region 105.

On the silicon oxide film, formed are the wiring 60, a wiring 108, and a wiring 109. The wiring 60 is electrically connected with the N-diffusion region 105 through contact holes. The wiring 108 is electrically connected with the P-diffusion region 102 and the N-diffusion region 103 through contact holes. The wiring 109 is electrically connected with the P-diffusion region 102 and the N-diffusion region 104 through contact holes.

The P-diffusion region 102, the N-diffusion regions 103, 104, and 105, the poly-silicon layers 106 and 107, and the wirings 108 and 109 are electrically connected with the ground potential.

Referring to FIG. 5, a wiring length Da between the electrostatic discharge protection circuit 42 and the through electrode 53 (a length from the through electrode 53 to a contact hole which is the closest connecting point to a protection element included in the electrostatic discharge protection circuit 42) is shorter than a wiring length Db between the circuit elements (the internal circuit 13) and the through electrode 53. As the example shown in FIG. 5, in a case where the electrostatic discharge protection circuit 42 and the circuit elements (the internal circuit 13) are disposed on a single path, when the wiring length is short, the wiring resistance is small. Accordingly, an electric charge more easily flows to the electrostatic discharge protection circuit 42 than to the circuit elements (the internal circuit 13). Therefore, damage on the circuit elements (the internal circuit 13) due to electrostatic discharge can be suppressed.

Further, when the electrostatic discharge protection circuit 42 is connected with the through electrode 53 at the smallest wiring resistance as shown in FIG. 5, an electric charge accompanied by electrostatic discharge more easily flows to the electrostatic discharge protection circuit 42 than to the circuit elements (the internal circuit 13). Therefore, damage on the circuit elements (the internal circuit 13) due to electrostatic discharge can be suppressed.

Further, when the electrostatic discharge protection circuit 42 and the circuit element 13 are disposed on a single path and the electrostatic discharge protection circuit 42 is connected with the through electrode 53 at the shortest wiring length as the example shown in FIG. 5, an electric charge accompanied by electrostatic discharge more easily flows to the electrostatic discharge protection circuit 42 than to the circuit elements (the internal circuit 13). Therefore, damage on the circuit elements (the internal circuit 13) due to electrostatic discharge can be suppressed.

First Modification

Figure 7:
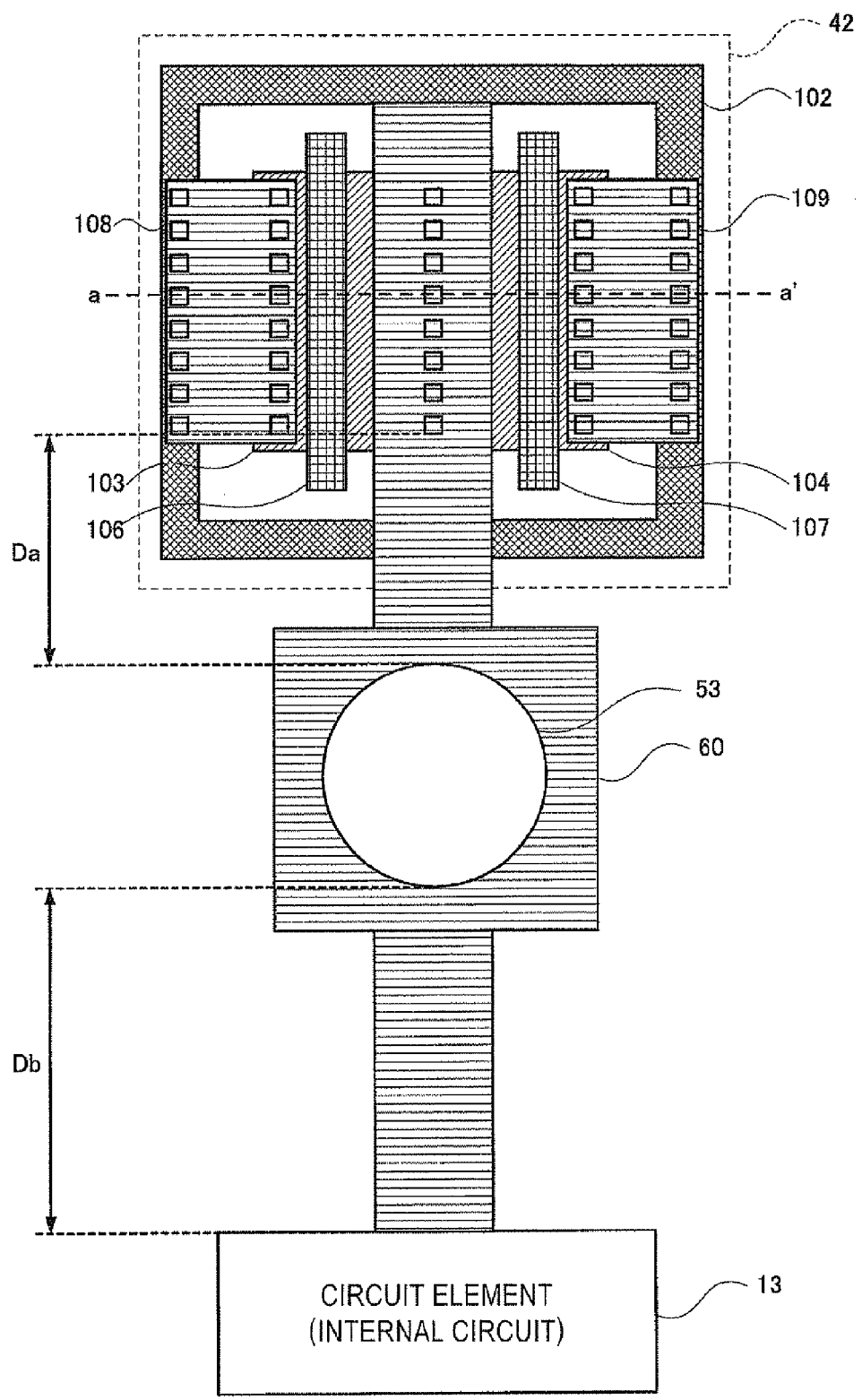
FIG. 7 is a plan view showing another example of arranging relationships between a through electrode and an electrostatic discharge protection circuit and between the through electrode and an internal circuit.

FIG. 7 is a plan view showing another example of arrangement relationships between a through electrode and an electrostatic discharge protection circuit and between the through electrode and an internal circuit.

Referring to FIG. 7, a wiring length Da between the electrostatic discharge protection circuit 42 and the through electrode 53 is shorter than a wiring length Db between the circuit elements (the internal circuit 13) and the through electrode 53. As the example shown in FIG. 7, in a case where the wiring widths are same as each other, when the wiring length is short, the wiring resistance is small. Accordingly, an electric charge more easily flows to the electrostatic discharge protection circuit 42 than to the circuit elements (the internal circuit 13). Therefore, damage on the circuit elements (the internal circuit 13) due to electrostatic discharge can be suppressed.

Further, when the electrostatic discharge protection circuit 42 is connected with the through electrode 53 at the smallest wiring resistance as shown in FIG. 7, an electric charge accompanied by electrostatic discharge more easily flows to the electrostatic discharge protection circuit 42 than to the circuit elements (the internal circuit 13). Therefore, damage on the circuit elements (the internal circuit 13) due to electrostatic discharge can be suppressed.

When the wiring widths are same as each other and the electrostatic discharge protection circuit 42 is connected with the through electrode 53 at the shortest wiring length as the example shown in FIG. 7, an electric charge accompanied by electrostatic discharge more easily flows to the electrostatic discharge protection circuit 42 than to the circuit elements (the internal circuit 13). Therefore, damage on the circuit elements (the internal circuit 13) due to electrostatic discharge can be suppressed.

Second Modification

Figure 8:
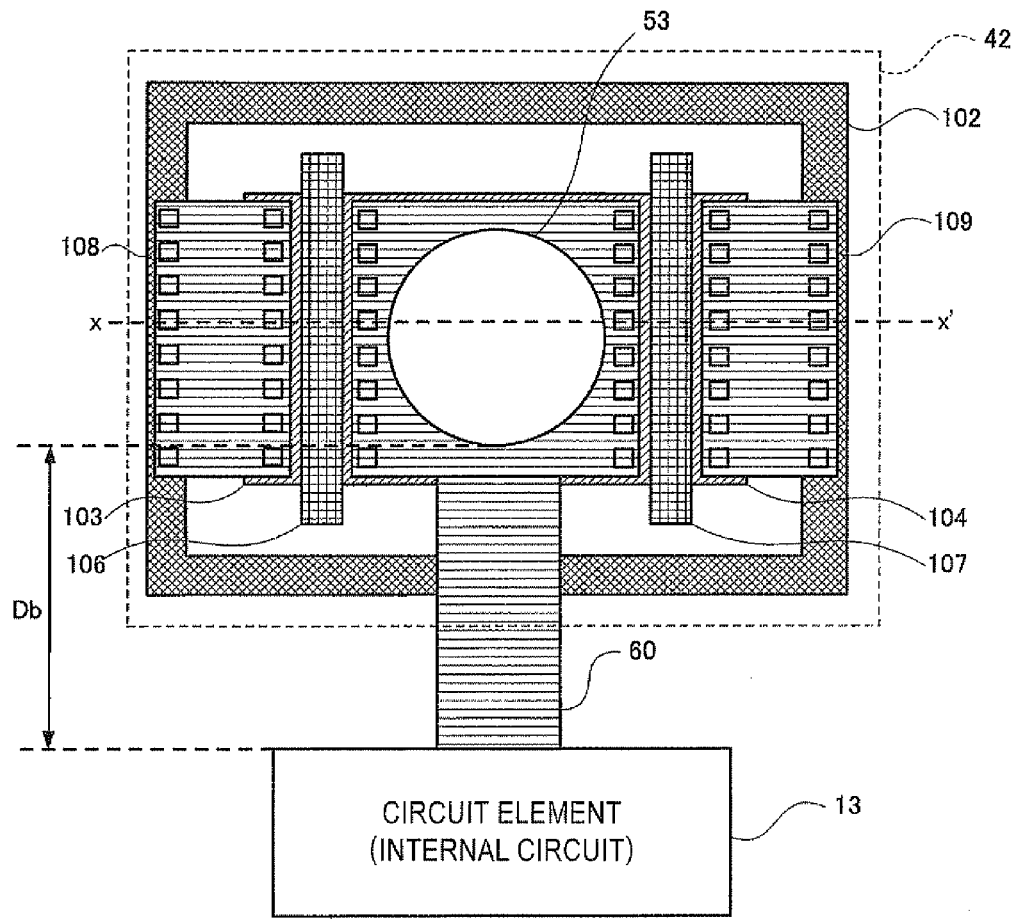
FIG. 8 is a plan view showing yet another example of arranging relationships between a through electrode and an electrostatic discharge protection circuit and between the through electrode and an internal circuit.
Figure 9:
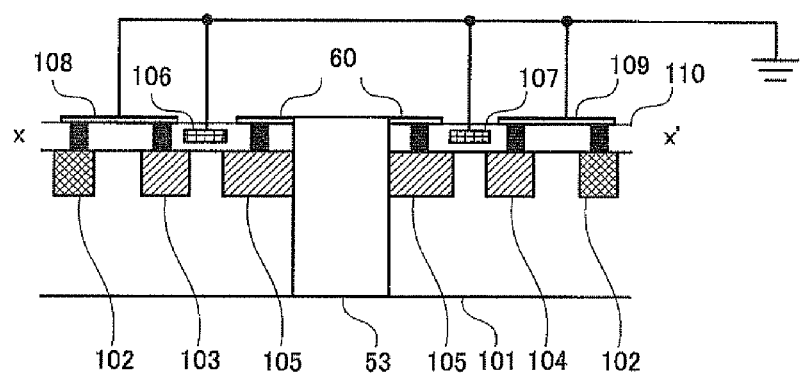
FIG. 9 is a schematic view for explaining a sectional structure of an electrostatic discharge protection circuit.

FIG. 8 is a plan view showing yet another example of arrangement relationships between a through electrode and an electrostatic discharge protection circuit and between the through electrode and an internal circuit. FIG. 9 is a schematic view for explaining a sectional structure of a through electrode and the electrostatic discharge protection circuit. FIG. 9 is a diagram showing a section taken along an x-x' line of FIG. 8. FIGS. 8 and 9 show an example in which a through electrode penetrates through a part of an element constituting an electrostatic discharge protection circuit.

In the example shown in FIGS. 8 and 9, the through electrode 53 is formed to penetrate through the N-diffusion region 105. Therefore, a wiring length Da between the electrostatic discharge protection circuit 42 and the through electrode 53 can be considered to be nil. Accordingly, in the example shown in FIG. 8 as well, the wiring length Da between the electrostatic discharge protection circuit 42 and the through electrode 53 is shorter than a wiring length Db between the circuit elements (the internal circuit 13) and the through electrode 53.

In the example shown in FIGS. 8 and 9, the electrostatic discharge protection circuit 42 is a circuit connected with the through electrode 53 at the smallest wiring resistance. Accordingly, an electric charge more easily flows to the electrostatic discharge protection circuit 42 than to the circuit elements (the internal circuit 13). Therefore, damage on the circuit elements (the internal circuit 13) due to electrostatic discharge can be suppressed.

Second Embodiment

Method for Manufacturing Semiconductor Device

The semiconductor device described with reference to FIGS. 1 to 9 can be realized by manufacturing a semiconductor device based on arrangement-wiring information determined such that wiring resistance between the electrostatic discharge protection circuit 42 and the through electrode 53 is smaller than wiring resistance between the circuit elements (the internal circuit 13) and the through electrode 53.

Further, the semiconductor device described with reference to FIGS. 1 to 9 can be realized by manufacturing a semiconductor device based on arrangement-wiring information determined such that a wiring length between the electrostatic discharge protection circuit 42 and the through electrode 53 is shorter than a wiring length between the circuit elements (the internal circuit 13) and the through electrode 53.

The arrangement-wiring information may be determined by preparing a design cell which defines an arrangement relationship between the through electrode 53 and the electrostatic discharge protection circuit 42 and determining a position of the design cell.

Figure 10A:
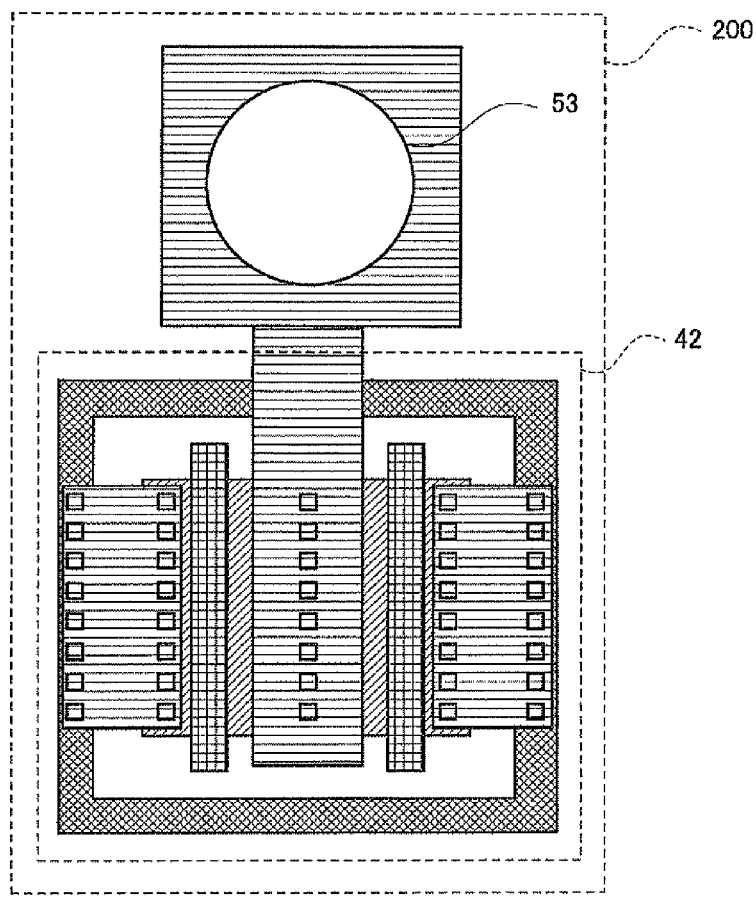
FIGS. 10A and 10B are plan views showing an example of a design cell.
Figure 10B:
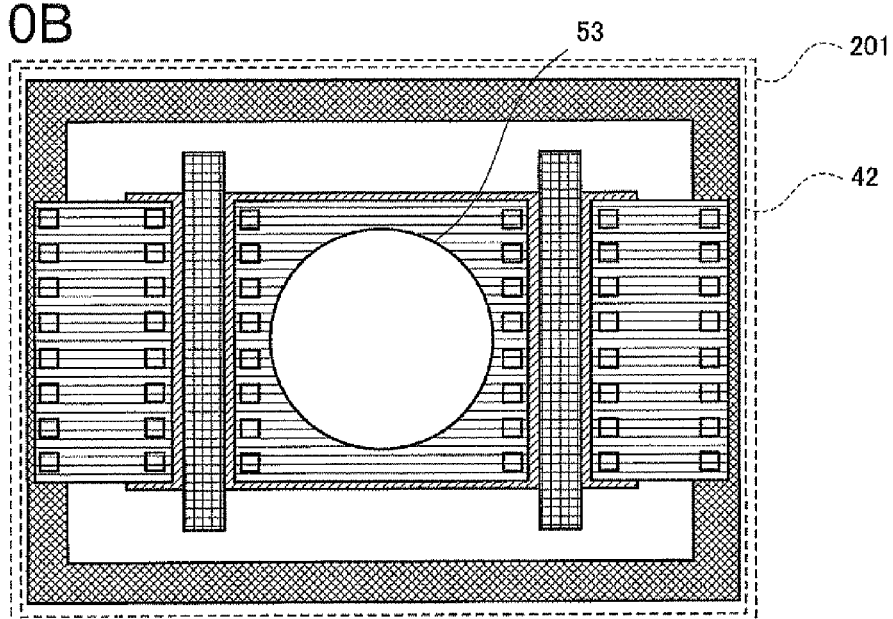

FIGS. 10A and 10B are plan views showing an example of a design cell used in layout software. FIG. 10A shows a design cell 200 of a case where the through electrode 53 and the electrostatic discharge protection circuit 42 are disposed on positions which do not overlap with each other. FIG. 10B shows a design cell 201 of a case where the through electrode 53 is formed to penetrate through the N-diffusion region of the electrostatic discharge protection circuit 42.

When the design cell defining the arrangement relationship between the through electrode 53 and the electrostatic discharge protection circuit 42 is prepared in advance, the arrangement-wiring information can be easily determined such that the wiring resistance between the electrostatic discharge protection circuit 42 and the through electrode 53 is smaller than the wiring resistance between the circuit elements (the internal circuit 13) and the through electrode 53, and the arrangement-wiring information can be easily determined such that the wiring length between the electrostatic discharge protection circuit 42 and the through electrode 53 is shorter than the wiring length between the circuit elements (the internal circuit 13) and the through electrode 53.

Figure 11:
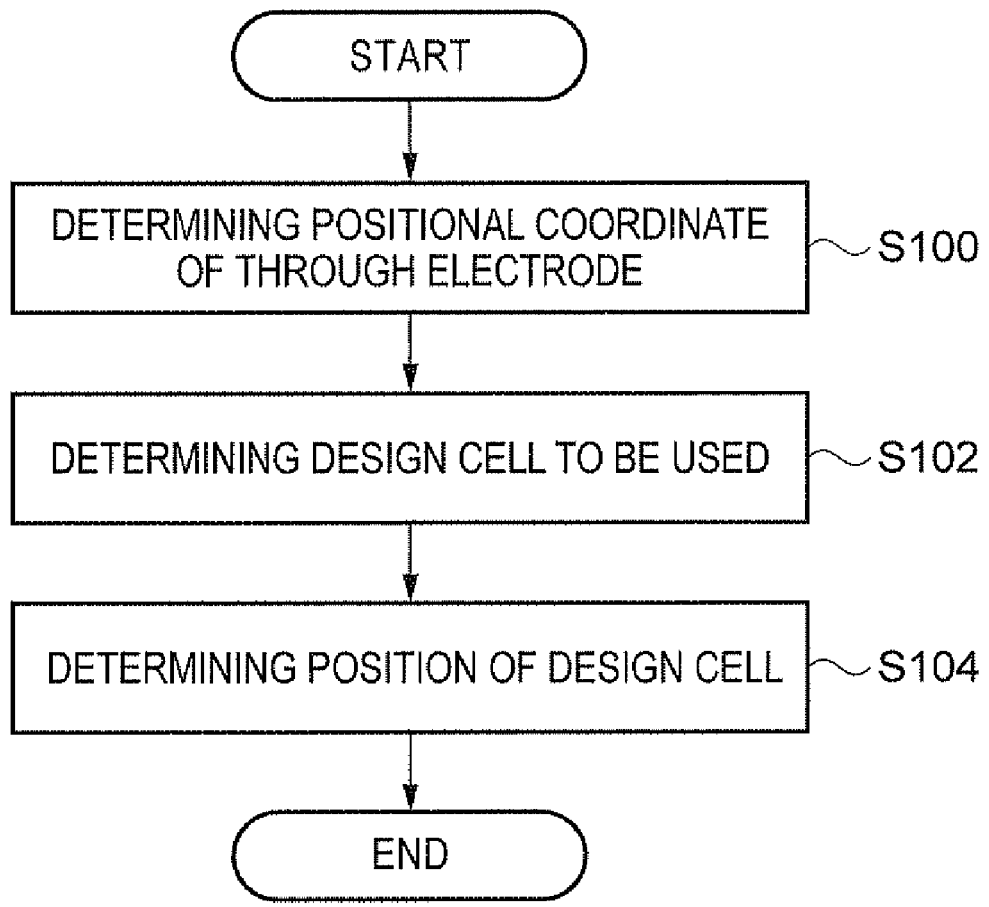
FIG. 11 is a flow chart showing an example of a method for determining arrangement-wiring information.

FIG. 11 is a flow chart showing an example of a method for determining arrangement-wiring information. Referring to FIG. 11, a case where there is a plurality kinds of design cells such as the design cells 200 and 201 will be described.

A positional coordinate of the through electrode on the semiconductor substrate is determined (step S100). Then a design cell to be used on the positional coordinate is determined (step S102). For example, which design cell is used between the design cells 200 and 201 is determined. Next, a position of the design cell determined in the step S102 is determined based on the positional coordinate of the through electrode determined in the step S100 (step S104). In the step S104, the position of the design cell is determined by rotating the design cell, for example, by a predetermined angle.

The method for determining the arrangement-wiring information described with reference to FIG. 11 is applicable to an automatic arrangement-wiring software, for example.

Here, it should be noted that the present invention is not limited to the above embodiments but is applicable to various kinds of modifications within the scope and the spirit of the present invention.

The present invention may include substantially the same structures as those described in the above embodiments (for example, the same functions, manners, and results, or the same advantages and advantageous effects as those in the above embodiments). In addition, the present invention includes structures obtained by replacing a nonessential part of the structures described in the embodiments. Further, the invention includes structures offering the same advantageous effects or structures achieving the same objects as those of the structures described in the embodiments. Furthermore, the present invention includes structures obtained by adding related art to the structures described in the embodiments.

For example, the embodiments show the example including the external terminals VDD, VSS, Pin1, and Pin2, but other external terminals such as an input terminal, an output terminal, a control terminal, and the like may be included.

Further, in a case where the electrostatic discharge protection circuit is composed of a plurality of protection elements and the plurality of protection elements are coupled at various connecting points, a wiring length between the through electrode and the closest connecting point may be set to be a wiring length.

What is claimed is:

1. A semiconductor device, comprising:
    a plurality of semiconductor substrates that are layered;
    a through electrode penetrating through a predetermined semiconductor substrate of the semiconductor substrates and electrically connected with an external terminal of the semiconductor device;
    a circuit element provided on the predetermined semiconductor substrate; and
    an electrostatic discharge protection circuit also provided on the predetermined semiconductor substrate, wherein wiring resistance between the electrostatic discharge protection circuit and the through electrode is smaller than wiring resistance between the circuit element and the through electrode.

2. The semiconductor device according to claim 1, wherein the electrostatic discharge protection circuit is connected with the through electrode at the smallest wiring resistance on the predetermined semiconductor substrate.

3. A semiconductor device, comprising:
    a plurality of semiconductor substrates that are layered;
    a through electrode penetrating through a predetermined semiconductor substrate of the semiconductor substrates and electrically connected with an external terminal of the semiconductor device;
    a circuit element provided on the predetermined semiconductor substrate; and
    an electrostatic discharge protection circuit also provided on the predetermined semiconductor substrate, wherein a wiring length between the electrostatic discharge protection circuit and the through electrode is shorter than a wiring length between the circuit element and the through electrode.

4. The semiconductor device according to claim 3, wherein the electrostatic discharge protection circuit is connected with the through electrode at the shortest wiring length on the predetermined semiconductor substrate.

5. The semiconductor device according to claim 1, wherein the through electrode penetrates through a part of an element constituting the electrostatic discharge protection circuit.

6. A method for manufacturing a semiconductor device, the semiconductor device including: a plurality of semiconductor substrates that are layered; a through electrode penetrating through a predetermined semiconductor substrate of the semiconductor substrates and electrically connected with an external terminal of the semiconductor device; a circuit element provided on the predetermined semiconductor substrate; and an electrostatic discharge protection circuit also provided on the predetermined semiconductor substrate,
the method comprising:
    determining arrangement-wiring information such that a wiring length between the electrostatic discharge protection circuit and the through electrode is shorter than a wiring length between the circuit element and the through electrode, wherein
the semiconductor device is manufactured based on the arrangement-wiring information.

7. The method for manufacturing a semiconductor device according to claims 6, wherein the arrangement-wiring information is determined by preparing a design cell that defines an arrangement relationship between the through electrode and the electrostatic discharge protection circuit and by determining a position of the design cell.

* * * * *